(12) United States Patent
Zhang et al.

(10) Patent No.: US 10,979,665 B2
(45) Date of Patent: Apr. 13, 2021

(54) EQUALIZATION CIRCUIT FOR CABLE TELEVISION PLUG-IN FIXED ATTENUATOR

(71) Applicant: Global Technology Inc., Ningbo (CN)

(72) Inventors: Li Zhang, Ningbo (CN); Mingjun Bao, Ningbo (CN); Renhao Tan, Ningbo (CN)

(73) Assignee: Global Technology Inc., Ningbo (CN)

( * ) Notice: Subject to any disclaimer, the term of this patent is extended or adjusted under 35 U.S.C. 154(b) by 218 days.

(21) Appl. No.: 16/238,249

(22) Filed: Jan. 2, 2019

(65) Prior Publication Data

US 2020/0007818 A1 Jan. 2, 2020

(51) Int. Cl.
*H04N 7/10* (2006.01)

(52) U.S. Cl.
CPC .................................. *H04N 7/102* (2013.01)

(58) Field of Classification Search
CPC ..... H04N 7/102; G01R 31/2825; G01R 15/04
USPC .................................. 725/127; 333/18, 28 R
See application file for complete search history.

(56) References Cited

U.S. PATENT DOCUMENTS

| | | | |
|---|---|---|---|
| 4,507,618 A * | 3/1985 | Nelson | G01R 13/22 330/126 |
| 6,054,905 A | 4/2000 | Gresko | |
| 2002/0190811 A1 * | 12/2002 | Sperber | H04B 3/143 333/28 R |
| 2006/0176044 A1 | 8/2006 | Binder et al. | |
| 2009/0322435 A1 * | 12/2009 | Moussavi | H03K 3/0322 331/57 |
| 2010/0266000 A1 | 10/2010 | Froimovich et al. | |
| 2014/0159987 A1 * | 6/2014 | Robert | H03H 7/40 343/861 |
| 2016/0028490 A1 * | 1/2016 | Wang | H04B 10/58 398/193 |

OTHER PUBLICATIONS

U.S. Office Action dated Jul. 8, 2020, received in U.S. Appl. No. 16/293,062, 12 pgs.

* cited by examiner

*Primary Examiner* — Alfonso Castro
(74) *Attorney, Agent, or Firm* — Grossman Tucker Perreault & Pfleger, PLLC

(57) ABSTRACT

Embodiments of the present disclosure disclose an equalization circuit for a CATV plug-in fixed attenuator which comprises an equalizer, an equalization compensation circuit and a MCU module. The equalizer comprises a CATV plug-in fixed attenuator identification module and an equalizing module. The CATV plug-in fixed attenuator identification module is connected to the equalizing module and the MCU module. The equalization compensation circuit is connected to an output terminal of the equalizer and the MCU module. The embodiments enable identification of a changing attenuation value and compensation of the frequency response.

6 Claims, 7 Drawing Sheets

| Attenuation | R1 value of T-type PAD | R2 value of T-type PAD |
|---|---|---|
| 0dB | / | / |
| 1dB | 4.308 | 650.739 |
| 2dB | 8.587 | 323.230 |
| 3dB | 12.811 | 213.138 |
| 4dB | 16.952 | 157.432 |
| 5dB | 20.987 | 123.515 |
| 6dB | 24.895 | 100.527 |
| 7dB | 28.656 | 83.817 |
| 8dB | 32.256 | 71.064 |
| 9dB | 35.683 | 60.979 |
| 10dB | 38.927 | 52.788 |
| 11dB | 41.983 | 46.000 |
| 12dB | 44.849 | 40.287 |
| 13dB | 47.524 | 35.418 |
| 14dB | 50.012 | 31.231 |
| 15dB | 52.316 | 27.602 |
| 16dB | 54.442 | 24.439 |
| 17dB | 56.399 | 21.669 |
| 18dB | 58.193 | 19.234 |
| 19dB | 59.834 | 17.088 |
| 20dB | 61.332 | 15.192 |

Figure 6

| Attenuation | R1 value of T-type PAD | R2 value of T-type PAD | Divided voltage |
|---|---|---|---|
| 0dB | / | / | 3.3 |
| 1dB | 4.308 | 650.739 | 3.278 |
| 2dB | 8.587 | 323.230 | 3.215 |
| 3dB | 12.811 | 213.138 | 3.113 |
| 4dB | 16.952 | 157.432 | 2.979 |
| 5dB | 20.987 | 123.515 | 2.821 |
| 6dB | 24.895 | 100.527 | 2.645 |
| 7dB | 28.656 | 83.817 | 2.459 |
| 8dB | 32.256 | 71.064 | 2.270 |
| 9dB | 35.683 | 60.979 | 2.082 |
| 10dB | 38.927 | 52.788 | 1.899 |
| 11dB | 41.983 | 46.000 | 1.725 |
| 12dB | 44.849 | 40.287 | 1.562 |
| 13dB | 47.524 | 35.418 | 1.409 |
| 14dB | 50.012 | 31.231 | 1.269 |
| 15dB | 52.316 | 27.602 | 1.140 |
| 16dB | 54.442 | 24.439 | 1.022 |
| 17dB | 56.399 | 21.669 | 0.916 |
| 18dB | 58.193 | 19.234 | 0.820 |
| 19dB | 59.834 | 17.088 | 0.733 |
| 20dB | 61.332 | 15.192 | 0.655 |

Figure 7

EQUALIZATION CIRCUIT FOR CABLE TELEVISION PLUG-IN FIXED ATTENUATOR

TECHNICAL FIELD

The present disclosure relates to the field of equalizers, and more particularly, to an equalization circuit for using with a cable television (CATV) plug-in fixed attenuator.

BACKGROUND

CATV signals may suffer from losses during transmission in cable or fiber in cable television networks. The attenuation of cables and fibers could worsen with increasing frequencies. Also, the attenuation of signals could be of a problem as signals travel over increased distance. Therefore, different attenuation slopes would correspond to signal transmission over different distances on the cable or fiber. Equalizers of different slope values are thus required to equalize the attenuation of the signals and balance the in-band curve, so as to maintain robustness and quality of the transmitted signals.

A CATV plug-in fixed attenuator with an equalization circuit is widely used in CATV products. The corresponding circuit is deployed on a main board and is capable of compensating the transmitted signals with different attenuation values including but not limited to 0 dB, 1 dB, 2 dB, or 20 dB.

Disadvantages of conventional arts by replacing the plug-in attenuators for compensating the slopes of the signals will change line impedance as well and affect the frequency response characteristics of the circuit. That is, the flatness of the signal waveforms for different slopes will experience significant changes, which in turn affect the characteristics of the signal transmission (with a flatness of about ±1.5 dB). The slope refers to the difference between the maximum gain and the minimum gain over a certain frequency range. The flatness refers to comparison between a linear relation and how close the relation between the gain and the frequency in a certain frequency range.

SUMMARY

One objective of one embodiment of the present disclosure is to provide an equalization circuit for a cable television (CATV) plug-in fixed attenuator which may improve the signal transmission response characteristics and quality.

An equalization circuit for a CATV plug-in fixed attenuator is disclosed. One embodiment of the disclosed attenuator may include an equalizer, an equalization compensation circuit, and a MCU module. The equalizer may include a CATV plug-in fixed attenuator identification module and an equalizing module. The CATV plug-in fixed attenuator identification module may be connected to the equalizing module and the MCU module. The equalization compensation circuit may be connected to an output terminal of the equalizer and the MCU module.

In some embodiments, the CATV plug-in fixed attenuator identification module may include a power supply module and a detection module to detect an output divided voltage value. The power supply module may be connected to an input terminal of the equalizing module. The detection module may be connected to an output terminal of the equalizing module and the MCU module.

In some embodiments, the CATV plug-in fixed attenuator identification module may include a voltage divider module connected to a ground terminal of the plug-in fixed attenuator to provide resistance.

In some embodiments, the power supply module may include a DC power supply, a first DC blocking capacitor, and a first inductor. The DC power supply may be connected in series with the first inductor and then connected to an input terminal of the plug-in fixed attenuator. One terminal of the first DC blocking capacitor may be connected to an input terminal of the first inductor, and the other terminal of the first DC blocking capacitor may be grounded.

In some embodiments, the detection module may include a second DC blocking capacitor and a second inductor. The second inductor may be connected between the output terminal of the plug-in fixed attenuator and a signal output terminal of the detection module. One terminal of the second DC blocking capacitor may be connected to the signal output terminal of the detection module, and the other terminal of the second DC blocking capacitor may be grounded.

In some embodiments, the voltage divider module may include a third DC blocking capacitor, a voltage dividing resistor and a third inductor. The third DC blocking capacitor may be connected between a ground terminal of the plug-in fixed attenuator and ground. One terminal of the third inductor may be connected to the ground terminal of the plug-in fixed attenuator, and the other terminal of the third inductor may be connected in series with the voltage dividing resistor and grounded.

In some embodiments, the equalization compensation circuit may include a digitally-controlled adjustable capacitor, a varactor diode and a compensation module. The MCU module controls the digitally-controlled adjustable capacitor and the varactor diode to adjust the frequency response of the compensation module.

The identification module of the embodiments may identify a CATV plug-in fixed attenuator and determine whether an operation on the cable is correct. The identification module may also locate and analyze a failure when it occurs. When the attenuator is replaced, the identification module identifies the latest attenuation value and the MCU module sends a command to change the frequency response of the compensation module accordingly to generate a signal with a corresponding waveform.

BRIEF DESCRIPTION OF THE DRAWINGS

FIG. 6 is table of resistance values for a 0-20 dB CATV plug-in fixed attenuator.

FIG. 7 is a table of voltage values for a corresponding detection module when r=0.

DETAILED DESCRIPTION

Embodiments of the present disclosure have been described with reference to the accompanying drawings. The disclosure can be embodied in various forms and should not be construed as limited to the embodiments set forth herein. The embodiments are intended for a thorough and complete understanding of the inventive concept. Throughout the description, like numbers refer to like elements.

The terminology used herein is for the purpose of describing particular example embodiments only and is not intended to be limiting. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Figure 1:
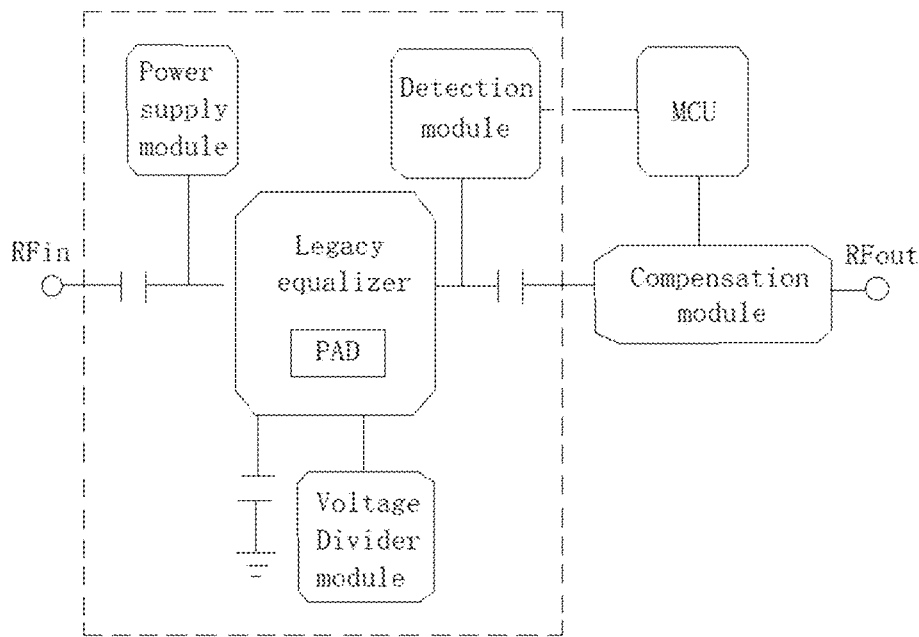
FIG. 1 is a circuit block diagram of an equalization circuit for a CATV plug-in fixed attenuator according to an embodiment.

FIG. 1 shows a circuit block diagram of an equalization circuit for a CATV plug-in fixed attenuator (PAD). The equalization circuit may include an equalizer, an equalization compensation circuit and a MCU module. The equalizer may include a CATV plug-in fixed attenuator identification module and an equalizing module. The CATV plug-in fixed attenuator identification module may be connected to the equalizing module and the MCU module. The equalization compensation circuit may be connected to an output terminal of the equalizer and to the MCU module.

Figure 2:
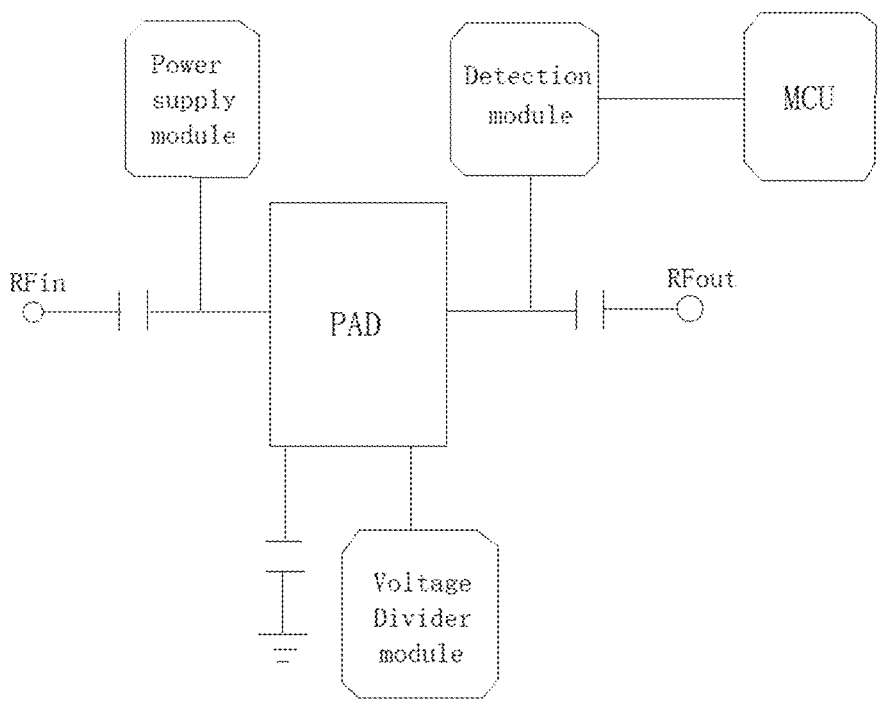
FIG. 2 is a circuit block diagram of a CATV plug-in fixed attenuator identification module of the equalization circuit according to an embodiment.
Figure 3:
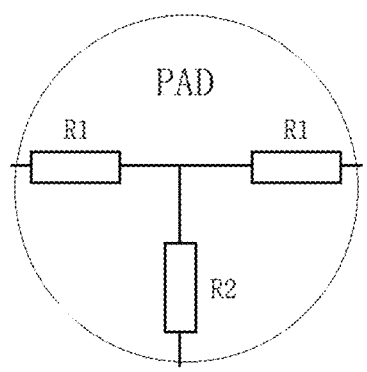
FIG. 3 is a structural schematic of a T-type attenuator of an identification circuit for a CATV plug-in fixed attenuator according to an embodiment.
Figure 4:
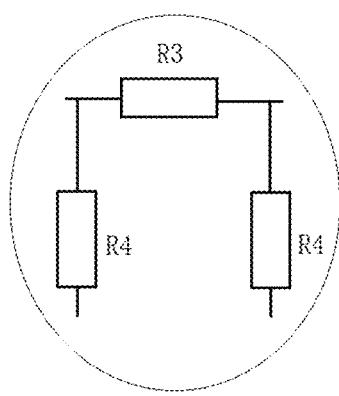
FIG. 4 is a structural schematic of a π-type attenuator of an identification circuit for a CATV plug-in fixed attenuator according to an embodiment.

FIG. 2 shows a circuit block diagram of a CATV plug-in fixed attenuator identification module of the equalization circuit. FIG. 3 shows a structural schematic of a T-type attenuator of an identification circuit for a CATV plug-in fixed attenuator. FIG. 4 shows a structural schematic of a i-type attenuator of an identification circuit for a CATV plug-in fixed attenuator. The CATV plug-in fixed attenuator identification module may include a power supply module, a detection module and a voltage divider module. The plug-in fixed attenuator may include a T-type attenuator and a i-type attenuator. The T-type attenuator may include two resistors R1 and one resistor R2. Various attenuation values can be achieved by using different combination of R1 and R2 of different resistance values. The i-type attenuator may include one resistor R3 and two resistors R4. Various attenuation values can be similarly achieved by using different combinations of R3 and R4 of different resistance values. The detection module may detect an output divided voltage value. The identification module may determine an attenuation value of the plug-in fixed attenuator based on the detected divided voltage value. The voltage divider module may function as one resistor for voltage dividing purpose. The power supply module may be connected to an input terminal of the plug-in fixed attenuator. The detection module may be connected to an output terminal of the plug-in fixed attenuator and to the identification module. The detection module is to detect an output divided voltage value. The detection module is connected to an output terminal of the plug-in fixed attenuator and to the identification module. The voltage divider module is connected to a ground terminal of the CATV plug-in fixed attenuator.

Figure 5:
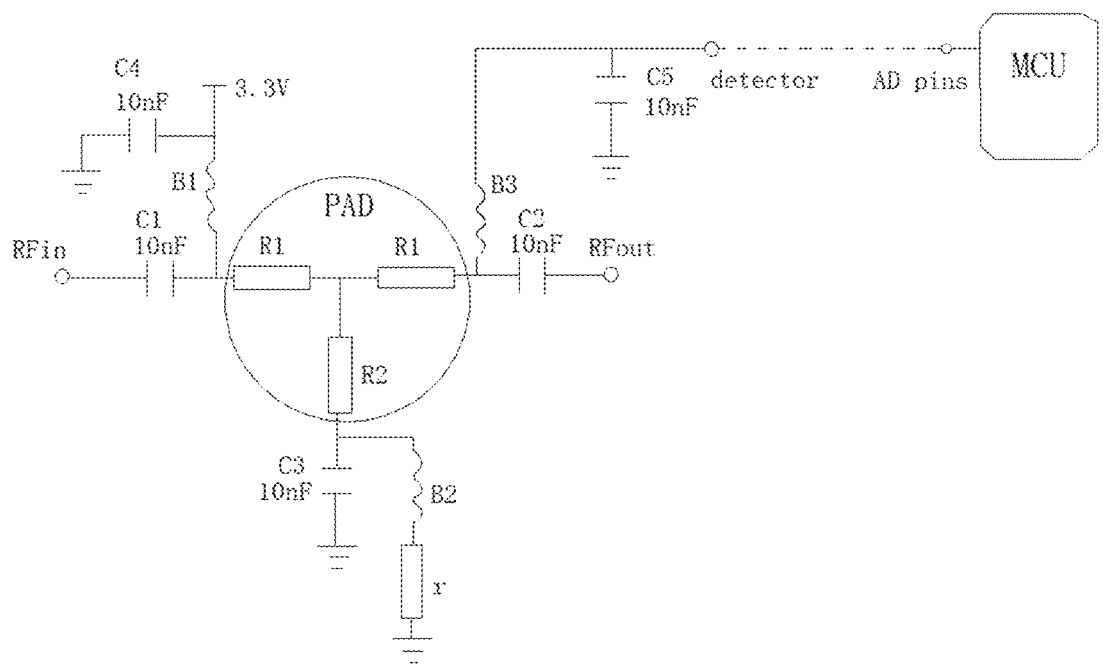
FIG. 5 is a circuit diagram of a CATV plug-in fixed attenuator identification module of the equalization circuit according to an embodiment.

FIG. 5 illustrates a circuit diagram of a CATV plug-in fixed attenuator identification module. The power supply module may include a DC power supply, a first DC blocking capacitor, and a first inductor. The DC power supply may be connected in series with the first inductor and then connected to an input terminal of the plug-in fixed attenuator. One terminal of the first DC blocking capacitor may be connected to an input terminal of the first inductor, and the other terminal of the first DC blocking capacitor may be grounded. The detection module may include a second DC blocking capacitor and a second inductor. The second inductor may be connected between an output terminal of the plug-in fixed attenuator and a signal output terminal of the detection module. One terminal of the second DC blocking capacitor may be connected to the signal output terminal of the detection module, and the other terminal of the second DC blocking capacitor may be grounded. The voltage divider module may include a third DC blocking capacitor, a voltage dividing resistor and a third inductor. The third DC blocking capacitor may be connected between a ground terminal of the plug-in fixed attenuator and the ground. One terminal of the third inductor may be connected to the ground terminal of the plug-in fixed attenuator, and the other terminal of the third inductor may be connected in series with the voltage dividing resistor and the ground.

In the circuit diagram, C1, C2, and C3 are the DC blocking capacitors to block DC voltage from reaching the RF circuits. B1, B2, and B3 are high-frequency magnetic beads to isolate the RF signals. As shown in FIG. 3, a DC voltage of, for example, 3.3 VDC is input from the right side of C1, with a branch consisted of R1, R2, B2 and r forming a conducting path. Since the impedance of the magnetic bead is nearly zero at low frequencies, a voltage detected by the detection module would a sum of the divided voltages on R2 and r: 3.3V/(R1+R2+r)*(R2+r). The pins of the detection module will be connected to the AD pins of the MCU identification module. Since the resistance values R1 and R2 of the resistors are different for different CATV plug-in fixed attenuators, the voltage values detected by the detection module would also vary.

FIG. 6 illustrates a table of resistance values for a 0-20 dB CATV plug-in fixed attenuator. FIG. 7 illustrates a table of voltage values for a corresponding detection module when r=0. The table of voltage values can be written into the MCU module. When switching between different CATV plug-in fixed attenuators, the detection module will generate different voltages accordingly and output the voltages to the AD pins of the MCU module. By looking up the table, the MCU module will derive an attenuation value of a CATV plug-in fixed attenuator. If no attenuator has been inserted, the detection module and the detected voltage on the AD pins of the MCU module is 0 V.

Figure 8:
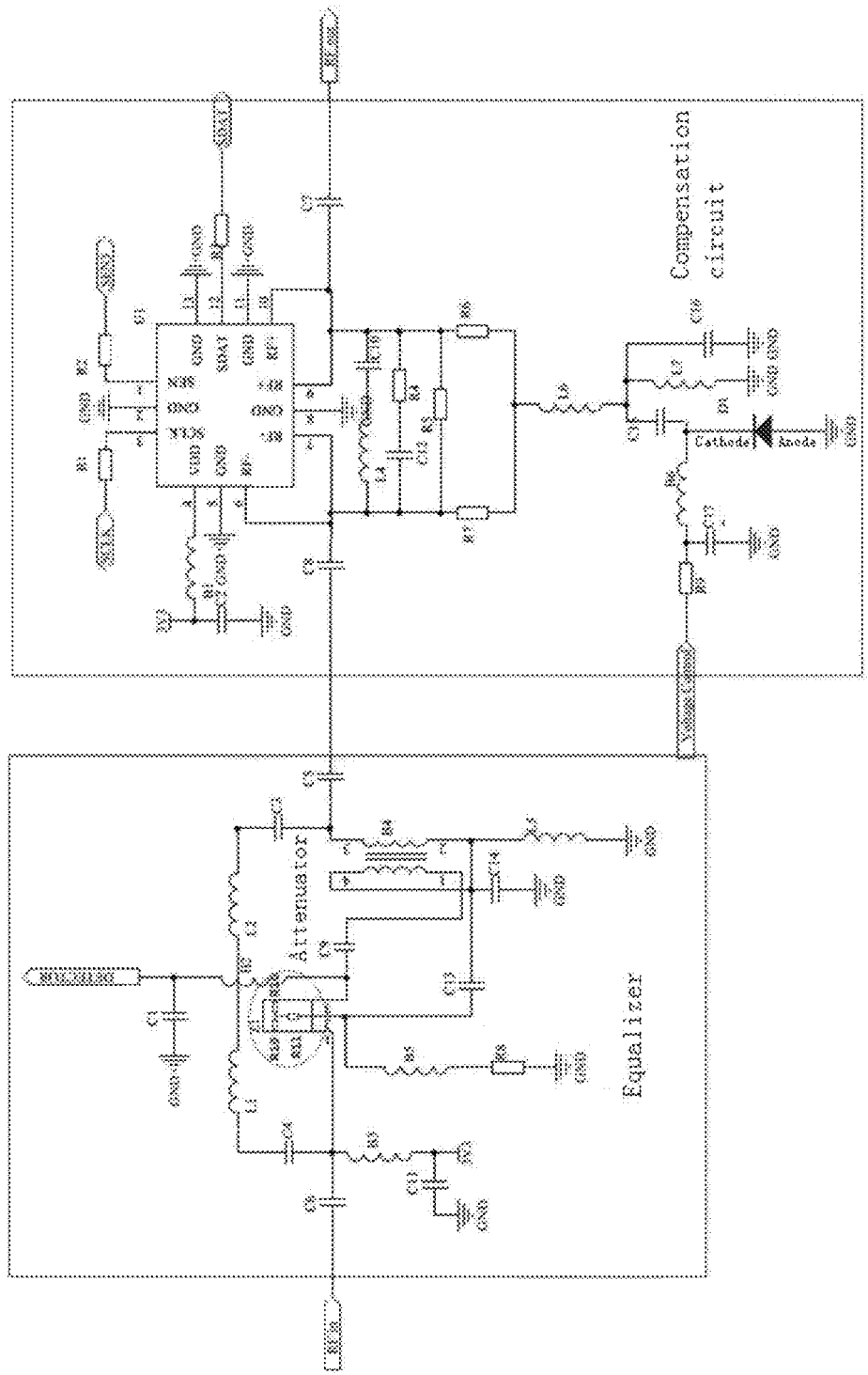
FIG. 8 is a circuit diagram of an equalization circuit for a CATV plug-in fixed attenuator according to an embodiment.

FIG. 8 illustrates a circuit diagram of an equalization circuit for a CATV plug-in fixed attenuator. The equalization circuit comprises a digitally-controlled adjustable capacitor, a varactor diode and a compensation module. The MCU module controls the digitally-controlled adjustable capacitor and the varactor diode to adjust the frequency response of the compensation module. When a different attenuator is selected, the identification module identifies the corresponding attenuation value and the MCU module sends a command to change the frequency response of the compensation module accordingly to generate a signal with an updated waveform for each slope.

As shown in FIG. 8, C5, C6, and C13 are the DC blocking capacitors to block the DC voltage from reaching the RF circuits. B2, B3, and B5 are high-frequency magnetic beads to isolate the RF signals. A DC voltage of, for example, 3.3 VDC is input from a right side of C11, with a branch consisted of R10, R11, B8 and B5 forming a conducting path. Since the impedance of the magnetic bead is nearly zero at low frequencies, a voltage detected by the detection module would be a sum of the divided voltages on R8 and R11: 3.3 V/(R10+R11+R8)*(R8+R11). The attenuation value of the CATV plug-in fixed attenuator corresponding to the detected voltage can be determined according to the table. The MCU will send corresponding commands to change the values of the digitally-controlled adjustable capacitor and the varactor diode to adjust the frequency response of the compensation module and improve the signal waveform.

Figure 9:
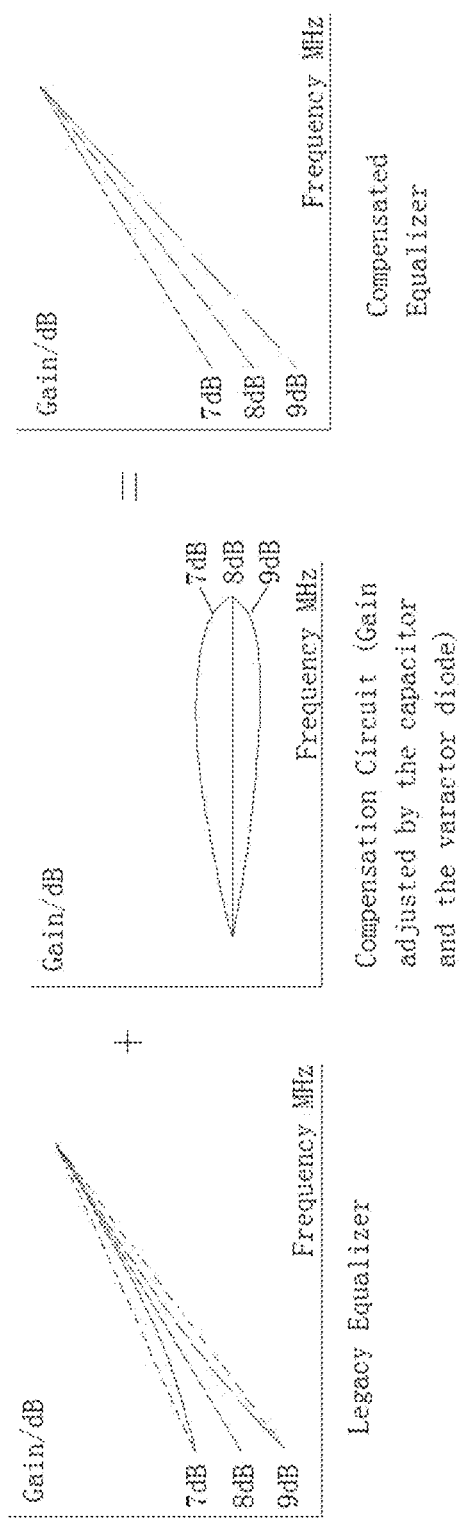
FIG. 9 illustrates compensation of gain curves by various equalization compensation circuits.

FIG. 9 illustrates compensation of gain curves by various equalization compensation circuits. Due to the limitation of legacy circuits, the flatness may be linear for 8 dB, but falls down for 7 dB and rises up for 9 dB. Therefore, the values of the digitally-controlled adjustable capacitor and the varactor diode may be adjusted upwardly for 7 dB for the compensation purpose. Similarly, the values of the digitally-controlled adjustable capacitor and the varactor diode may decrease for 9 dB for the compensation purpose. The flatness for the gain curve of each slope can be adjusted in this fashion.

Figure 10:
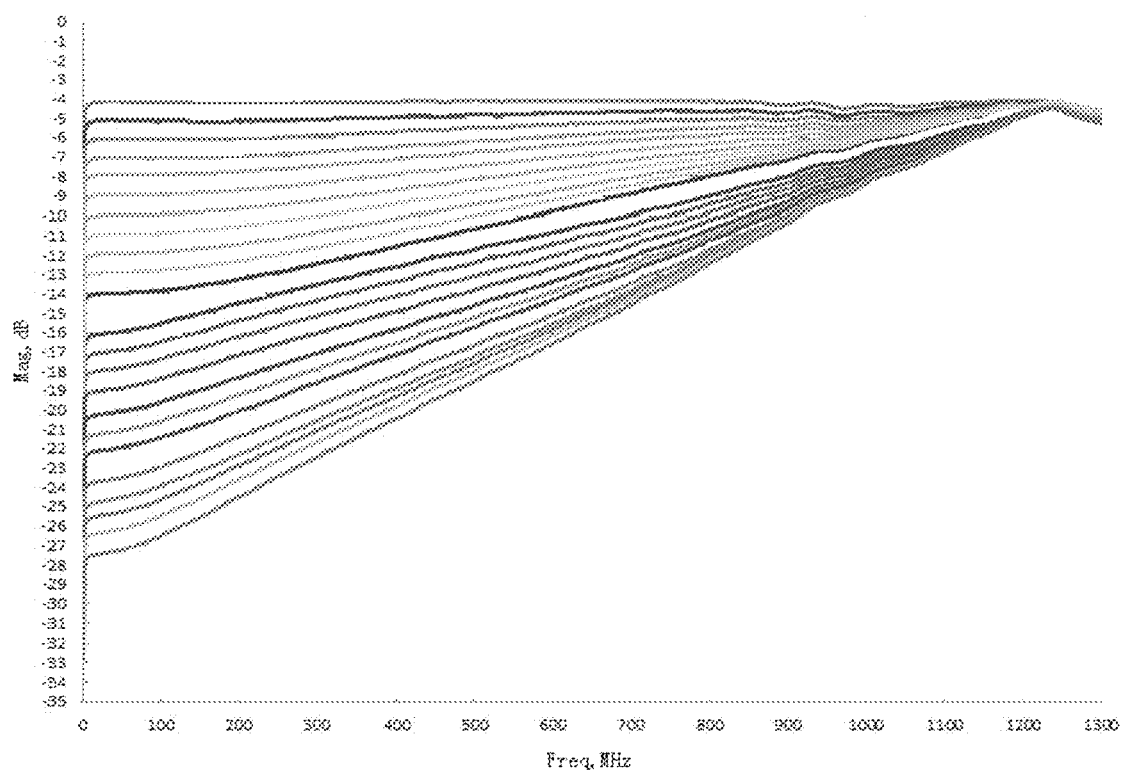
FIG. 10 illustrates the flatness of gain curves of different slopes for various equalization compensation circuits.

FIG. 10 illustrates the flatness of gain curves of different slopes for various equalization compensation circuits. The table shows the slope and flatness of each gain curve as the attenuation value changes between 0 dB and 22 dB. The deviation of the slope is within 0.5 dB for the attenuation values ranging between 0 dB and 22 dB. The deviation of the flatness is within 0.35 dB for attenuation values ranging between 0 dB and 22 dB.

The foregoing description of the embodiments has been provided for purposes of illustration and description. It is not intended to be exhaustive or to limit the disclosure. Variations or modifications of the embodiments are not to be regarded as a departure from the disclosure, and all such modifications are intended to be included within the scope of the disclosure.

What is claimed is:

1. An equalization circuit for a cable television (CATV) plug-in fixed attenuator, comprising:
    an equalizer, an equalization compensation circuit and a microcontroller unit (MCU) module; wherein
    the equalizer comprises a CATV plug-in fixed attenuator identification module and an equalizing module;
    the CATV plug-in fixed attenuator identification module is connected to the equalizing module and the MCU module; and
    the equalization compensation circuit is connected to an output terminal of the equalizer and the MCU module wherein the equalization compensation circuit comprises a digitally controlled adjustable capacitor, a varactor diode and a compensation module, the MCU module controls the digitally controlled adjustable capacitor and the varactor diode to adjust a frequency response of the compensation module.

2. The equalization circuit of claim 1, wherein the CATV plug-in fixed attenuator identification module further comprises a power supply module to supply a power and a detection module to detect an output divided voltage value, the power supply module is connected to an input terminal of the equalizing module, and the detection module is connected to an output terminal of the equalizing module and the MCU module.

3. The equalization circuit of claim 2, wherein the CATV plug-in fixed attenuator identification module further comprises a voltage divider module functioning as resistance for voltage dividing purpose and connected to a ground terminal of the plug-in fixed attenuator.

4. The equalization circuit of claim 2, wherein the power supply module comprises a DC power supply, a first DC blocking capacitor, and a first inductor, the DC power supply is connected in series with the first inductor and to an input terminal of the plug-in fixed attenuator; one terminal of the first DC blocking capacitor is connected to an input terminal of the first inductor, and the other terminal of the first DC blocking capacitor is grounded.

5. The equalization circuit of claim 2, wherein the detection module includes a second DC blocking capacitor and a second inductor, the second inductor is connected between the output terminal of the plug-in fixed attenuator and a signal output terminal of the detection module, one terminal of the second DC blocking capacitor is connected to the signal output terminal of the detection module, and the other terminal of the second DC blocking capacitor is grounded.

6. The equalization circuit of claim 3, wherein the voltage divider module includes a third DC blocking capacitor, a voltage dividing resistor and a third inductor, the third DC blocking capacitor is connected between a ground terminal of the plug-in fixed attenuator and ground, one terminal of the third inductor is connected to the ground terminal of the plug-in fixed attenuator, and the other terminal of the third inductor is connected in series with the voltage dividing resistor and grounded.

* * * * *